(12) United States Patent
Aoki et al.

(10) Patent No.: US 7,005,009 B2
(45) Date of Patent: Feb. 28, 2006

(54) FILM FORMING APPARATUS, FILM FORMING METHOD AND TRAY FOR SUBSTRATE

(75) Inventors: Taiichiro Aoki, Kanagawa (JP); Seiji Ohishi, Kanagawa (JP); Hiroshi Yamabe, Okayama (JP); Hitoshi Obata, Okayama (JP)

(73) Assignees: Tokyo Ohka Kogyo Co., Ltd., Kanagawa (JP); Tazmo Co., Ltd., Okayama (JP)

( * ) Notice: Subject to any disclaimer, the term of this patent is extended or adjusted under 35 U.S.C. 154(b) by 197 days.

(21) Appl. No.: 10/308,964

(22) Filed: Dec. 3, 2002

(65) Prior Publication Data

US 2003/0134044 A1   Jul. 17, 2003

(30) Foreign Application Priority Data

Dec. 3, 2001  (JP) ............................. 2001-369243
Nov. 28, 2002  (JP) ............................. 2002-346230

(51) Int. Cl.
   *B05C 13/00*   (2006.01)
(52) U.S. Cl. ......................................... 118/66; 118/70
(58) Field of Classification Search ................. 118/66, 118/109, 413, 414, 72–74, 70, 59; 134/902, 134/61, 66
See application file for complete search history.

(56) References Cited

U.S. PATENT DOCUMENTS

| | | | | |
|---|---|---|---|---|
| 4,418,639 A | * | 12/1983 | Wills et al. | 118/50 |
| 5,099,782 A | * | 3/1992 | Nakazawa et al. | 118/52 |
| 5,266,113 A | * | 11/1993 | Konno | 118/74 |
| 6,395,335 B1 | * | 5/2002 | Onishi et al. | 427/282 |

\* cited by examiner

*Primary Examiner*—Brenda A. Lamb
(74) *Attorney, Agent, or Firm*—Carrier, Blackman & Associates, P.C.; Joseph P. Carrier; William D. Blackman

(57) ABSTRACT

The object of the present invention is to provide an apparatus suitable for forming a thick film having a thickness on a surface of a substrate such as a glass substrate, a semiconductor wafer or the like. In the apparatus according to the present invention, a stock station for a substrate and a treatment station for a substrate are adjacent to each other, portions for coating, film-forming, cleaning and drying are provided in the treatment station, a tray having a concave portion for accommodating a substrate defined on the surface thereof is provided, and a transfer device circulates the tray around the portions for coating, film-forming, cleaning and drying.

10 Claims, 12 Drawing Sheets

(a)   (b)   (c)

(a)　　　　　　　　　　　　(b)

(c)

FILM FORMING APPARATUS, FILM FORMING METHOD AND TRAY FOR SUBSTRATE

BACKGROUND OF THE INVENTION

1. Field of the Invention

The present invention relates to a method and an apparatus suitable for forming a thick film having a thickness, for example, of 20 μm or more on a surface of a substrate such as a glass substrate, a semiconductor wafer or the like, and also relates to a tray for use in a film-forming process.

2. Description of the Prior Art

Conventionally, for forming a resist film or a SOG film on a substrate such as a glass substrate, a semiconductor wafer or the like, a spin coating method and a slit nozzle method have been known.

In the spin coating method, a plate-like material to be treated is spun by a spinner at a high rate, and a coating liquid, which drops at the center of the plate-like material, is dispersed by a centrifugal force. In a method, such as disclosed in Japanese Unexamined Patent Application Publication No. Hei 3-56163, a concave portion is defined on the upper surface of the spinner head to accommodate a plate-like material to be treated.

In the slit nozzle method such as disclosed in U.S. Pat. No. 4,696,885, a coating liquid is discharged from a slit nozzle having almost the same width as a plate-like material to be treated, and the coating liquid is applied on a predetermined area by moving the plate-like material with respect to the slit nozzle.

Recently, trials of forming a thick film on a surface of a substrate have been performed. For example, it is necessary to form a resist film having a thickness of around 20 μm so as to form a protruding electrode, which is referred to as a bump, having a height of around 20 μm on a surface of an IC pattern by applying integrated circuit forming technology.

In addition, wire bonding, which has conventionally been used for mounting an IC chip on a substrate, requires labor and time because it is necessary to connect metal wires one by one in wire bonding. Thus, instead of wire bonding, there is another way, in which a plurality of metal posts are provided on a chip, and the chip is mounted on a substrate via the posts. Since the metal posts have a height of around 100 μm, it is necessary to form a resist film having a thickness of around 100 μm so as to form metal posts by applying integrated circuit forming technology.

However, in the spin coating method, only 5% or so of the supplied coating liquid can be used to form a film, and a large part of the coating liquid is scattered away by the centrifugal force. Thus, a thick film cannot be formed, which is a drawback.

In addition, there is a tendency that the size of a substrate (glass substrate) is increased and the thickness is reduced. Therefore, there is another drawback that the substrate is undesirably flexed due to its weight at the time of transfer or the like.

On the other hand, in the slit nozzle method, the consumption of a coating liquid can be reduced and the thickness of a film can be increased. However, this method has a drawback that the film thickness becomes extremely greater at the point where coating is started and the point where the coating is ended compared to the other points because of the surface tension.

Moreover, the above-mentioned prior art materials relate to processes up to applying a coating liquid. Specifically, the prior art materials are not directed to improvement of the efficiency in a process of heating and drying a coating liquid after being applied and the subsequent processes.

In particular, in a case of forming a thick film, there is a problem unique to a conventional apparatus because the size of a substrate becomes large nowadays. Specifically, at the time of heating and drying a coating liquid applied to a substrate, the surface of the coating liquid is dried and cured earlier than the inside of the coating liquid. As a result, a solvent contained in the inside of the coating liquid cannot be discharged, and the residual ratio of a solvent becomes different depending on the area of the coating liquid. This causes a problem that a pattern having a high aspect ratio is stripped from the surface of a substrate after development and/or wrinkling is generated in the coating film.

Also, even if it is possible to prevent a substrate from being flexed in the course of processes by transferring the substrate in a state of being mounted on a tray, there is a strong likelihood that the substrate will be broken because of its weight when the substrate is lifted from the tray in a case of forming a thick film on the substrate.

SUMMARY OF THE INVENTION

According to a first aspect of the present invention, for the purpose of overcoming the problem mentioned above, there is provided an apparatus for forming a film comprising a stock station for a substrate, a treatment station for a substrate adjacent to the stock station, individual portions respectively for coating, film-forming, cleaning and drying provided in the treatment station, a tray having a concave portion for accommodating a substrate defined on the surface thereof, and a transfer device circulating the tray among the portions for coating, film-forming, cleaning and drying.

With the circulating tray structure, it is possible to greatly improve the processing efficiency. Incidentally, as a means for forming a film in the film-forming portion, heating and drying including hot-air drying and warm-air drying, reduced-pressure drying, or spontaneous drying may be used. The tray is cleaned in the cleaning portion and dried in the drying portion.

According to another aspect of the present invention, in the above-mentioned apparatus, a squeegee is provided in the coating portion. Further, the squeegee may be attached to a slit nozzle which is provided in the coating portion.

With this, it is possible to apply a coating liquid in a uniform thickness without the need for accurate slit nozzle processing unlike the case of the prior art.

According to another aspect of the present invention, there is provided a method for forming a film comprising the steps of applying a coating liquid to the surface of a substrate and heating and drying the applied liquid so as to form a film, wherein the temperature of the substrate is gradually increased to a predetermined temperature in a state where the temperature gradient of the substrate is negative with respect to the direction from the center of the substrate to the periphery of the substrate. Further, the heating and drying step may be conducted under a pressure that is gradually reduced, spending one minute or more, to $10^{-2}$ Torr.

With the temperature gradient, it is possible to securely discharge the solvent from the coating liquid, and thereby it is possible to prevent the residual ratio of the solvent from becoming different depending on the area. Also, by conducting the heating and drying steps with the gradually reduced pressure, a problem such as bursting can be prevented.

According to another aspect of the present invention, there is provided a tray for transferring and treating a substrate comprising an outer member having an annular shape and an inner member, wherein a concave portion for accommodating a substrate is defined by attaching the inner member to the outer member so as to cover the opening of the outer member, and wherein the position of the inner member is allowed to be adjusted with respect to the outer member in the thickness direction. Further, a passage used for vacuum suction and gas-blowing release may be provided in the inner member. Furthermore, a coupler may be provided to couple the passage to a vacuum source or a compressed-air source. The coupler can also be used as a member for adjusting the position of a tray.

With this devised structure of the tray, it is possible to correspond to various kinds of substrates and prevent a substrate from being broken at the time of release from the tray. Also, it becomes easy to adjust the position at the time of transfer between different devices.

DETAILED DESCRIPTION OF PREFERRED EMBODIMENTS

Hereinafter, embodiments according to the present invention will be explained with reference to the attached drawings.

Figure 1:
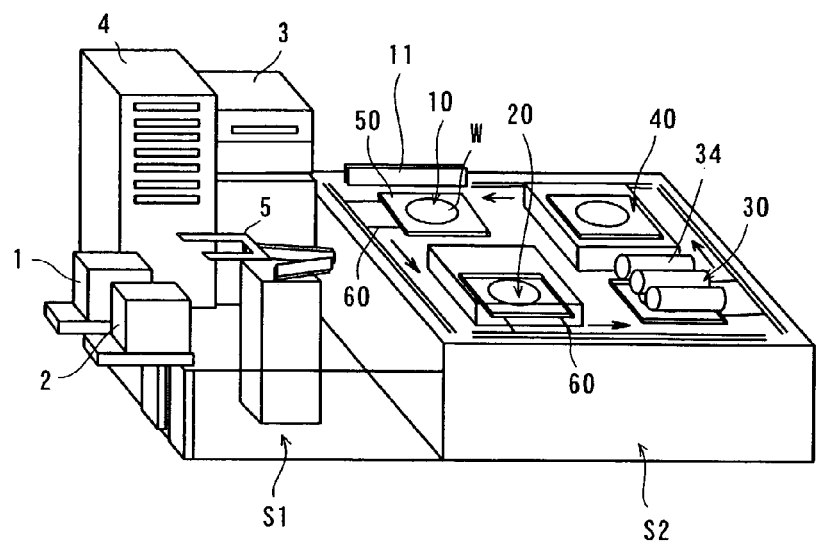
FIG. 1 is a perspective view showing an embodiment of the whole structure of a film forming apparatus according to the present invention.

As shown in FIG. 1, a film forming apparatus according to the present invention comprises a stock station for a substrate S1 and a treatment station S2 which are adjacent to each other. In the stock station S1, there are provided a cassette 1 for accommodating an untreated substrate, a cassette 2 for accommodating a treated substrate, an edge cleaning device 3, a drying device 4 and a handling device 5 for transferring, passing and receiving substrates.

Figure 2:
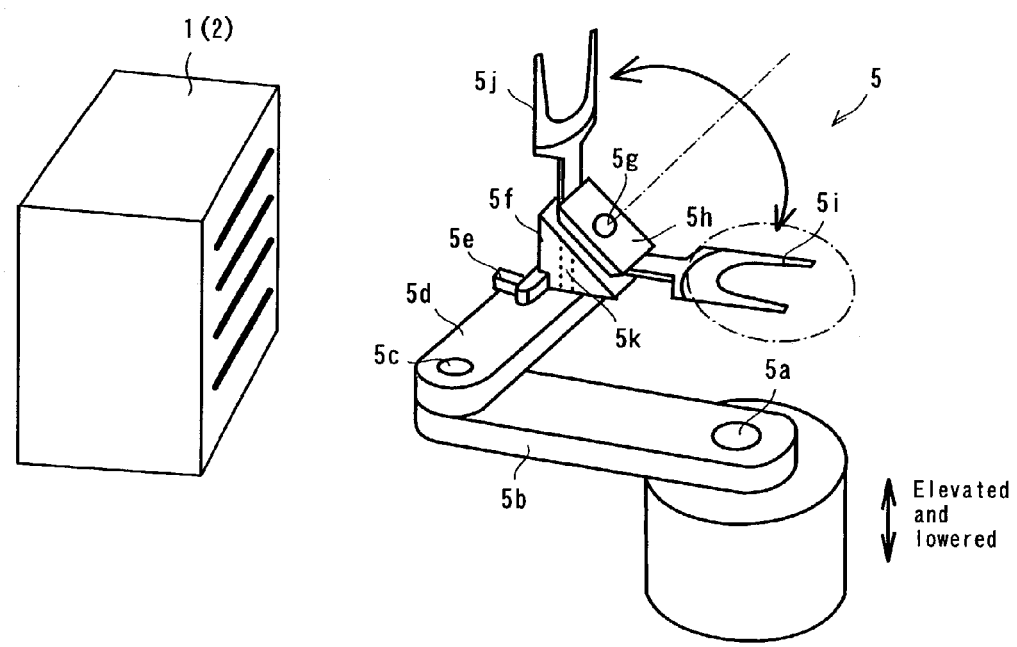
FIG. 2 is a perspective view of a handling device according to the embodiment of the present invention.
Figure 3:
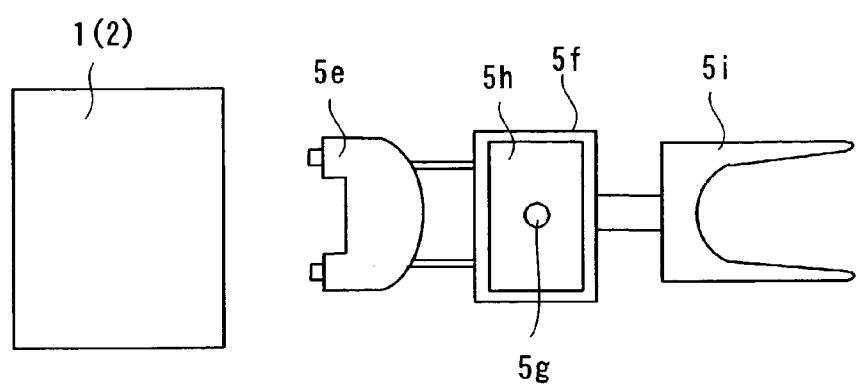
FIG. 3 is a plan view of the handling device according to the present invention.

The handling device 5, which is shown in FIGS. 2–3, is elevated and lowered by an elevator mechanism (not shown). The handling device 5 comprises an arm 5b which is rotatable based on an axis 5a in the horizontal direction, an arm 5d which is rotatable based on an axis 5c in the horizontal direction with respect to the arm 5b, a supporting block 5f which is rotatable based on an axis 5k provided in the arm 5d, a sensor 5e which is attached to the supporting block 5f, a plate 5h which is attached to a 45 degrees angled surface of the supporting block 5f and rotatable based on an axis 5g, and hands 5i, 5j which are attached to both ends of the plate 5h.

The hands 5i, 5j are at 90 degrees with respect to each other. When the supporting block 5f is rotated by 90 degrees based on the axis 5k, the back and forth position of the hands 5i, 5j is changed. When the plate 5h is rotated by 180 degrees around the axis 5g, the up and down position of the hands 5i, 5j is changed. The hands 5i, 5j retain a substrate in a state of being horizontal. By changing the position of the hands 5i, 5j, the hand 5i retains an untreated substrate and the hand 5j retains a treated substrate, for example.

The sensor 5e for searching for a wafer (substrate) is directed toward the cassette 1 for accommodating an untreated substrate. The whole handling device 5 is elevated and lowered by the elevator mechanism (not shown). In this instance, the sensor 5e searches for a wafer. The supporting block 5f is rotated based on the axis 5k, and thereby the hand 5i is opposed to the cassette 1. The hand 5i withdraws a wafer and transfers it to a coating portion 10. Then, treatment is started.

Conventionally, sensors 5e for searching for a wafer are attached to the cassette 1 or adjacent to the cassette 1. However, by attaching the sensor 5e for searching for a wafer directly to the handling device 5, it becomes unnecessary to attach the sensor 5e for searching for a wafer to each cassette 1, and thereby it becomes possible to achieve a simple apparatus and cost reduction. Incidentally, during the search, a wafer is considered to be present in a case where light emitted from the sensor is reflected, while a wafer is considered to be absent in a case where light emitted from the sensor is not reflected.

A treated substrate is accommodated in the cassette 2 in a reverse operation to the above-mentioned one. Since the treated substrate has been heated, the temperature of the hand, which retains the substrate, also becomes high. If such a hand of a high temperature is used for retaining an untreated substrate, the temperature distribution of the untreated substrate becomes non-uniform. Thus, by designating one hand for retaining an untreated substrate and the other hand for retaining a treated substrate in advance, it is possible to prevent the above-mentioned drawback from being caused.

The treatment station S2 is divided into four equal areas. A coating portion 10, a film-forming portion 20, a cleaning portion 30 and a drying portion 40 are correspondingly provided in the four areas. The treatment station S2 also comprises a transfer device 60 for feeding a tray 50 sequentially into the coating portion 10, the film-forming portion 20, the cleaning portion 30 and the drying portion 40 and drawing the tray 50 therefrom.

The tray 50 is circulated around the coating portion 10, the film-forming portion 20, the cleaning portion 30 and the drying portion 40 by the transfer device 60. In the drawing, the transfer device 60 is provided on the periphery of the treatment station S2. However, the transfer device 60 may be provided in the boundary between each portion or in the center of the treatment station S2.

Figure 4:
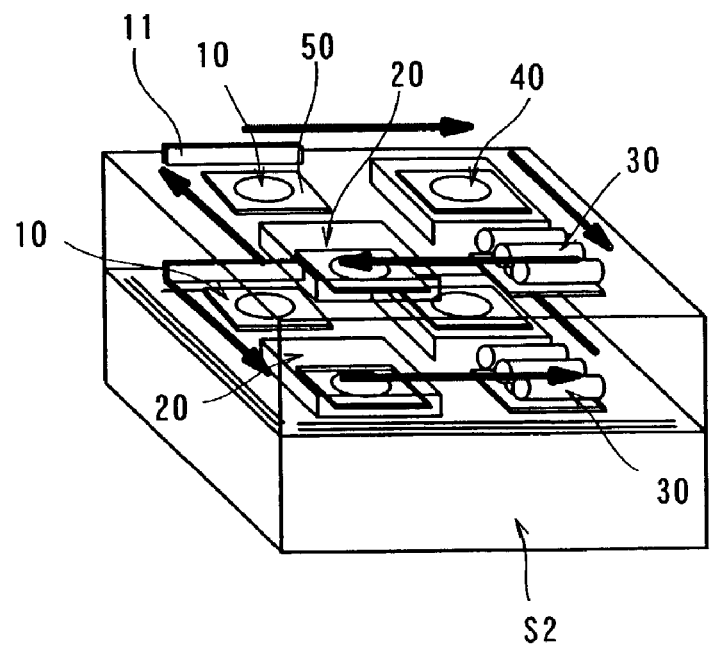
FIG. 4 is a perspective view showing another embodiment of a treatment station of a film forming apparatus according to the present invention.

FIG. 4 is a view showing another embodiment of the treatment station of the film forming apparatus. In this embodiment, the treatment station has two stages, and the coating portion 10, the film-forming portion 20, the cleaning portion 30 and the drying portion 40 are provided in each stage. The trays 50 may be moved in the reverse direction with respect to each other as shown in the drawing.

Figure 5:
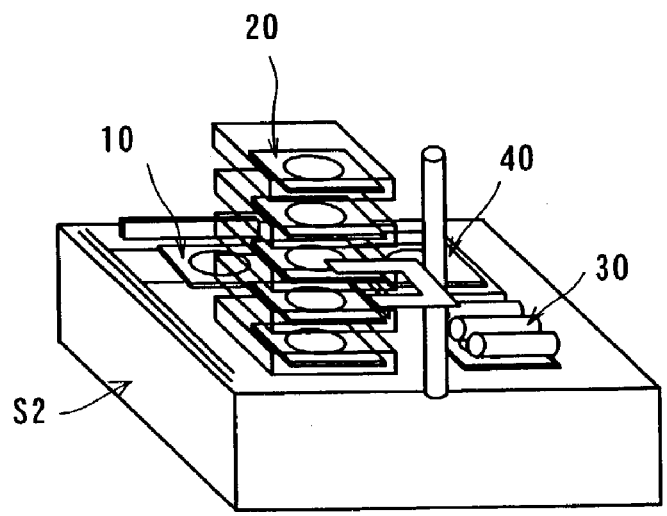
FIG. 5 is a perspective view showing another embodiment of a film-forming portion of a treatment station of a film forming apparatus according to the present invention.

FIG. 5 is a view showing another embodiment of the film-forming portion 20 of the treatment station of the film forming apparatus. In this embodiment, the film-forming portion 20 has a plurality of stages so as to improve the treatment efficiency.

Figure 6:
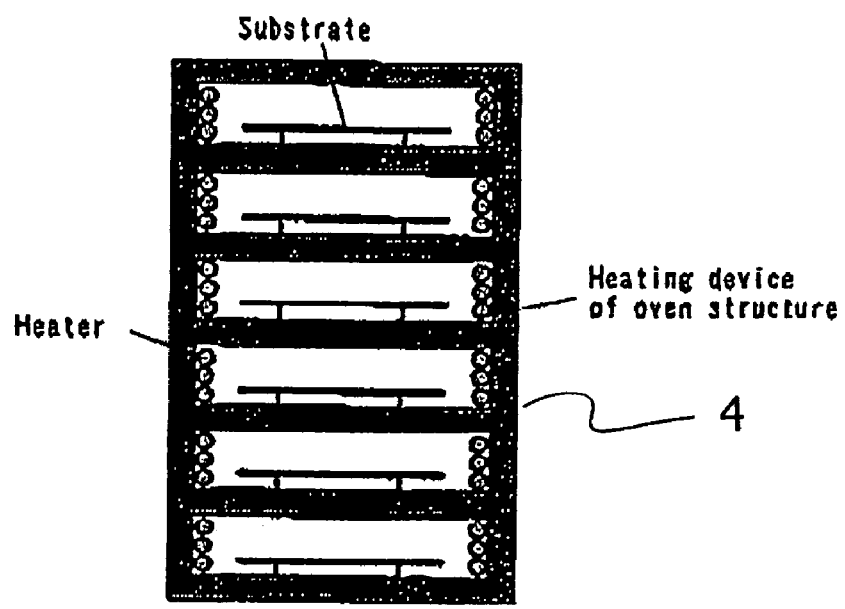
FIG. 6 is a vertical sectional view showing another embodiment of a drying device according to the present invention.

In another embodiment shown in FIG. 6, the drying device 4 has a plurality of stages, and the entire device is a heating device, specifically an oven structure having a heater formed in the wall surface thereof, instead of providing a hot plate in each stage. With this structure, it is possible to heat a substrate from both the upper and lower surfaces, and it is also possible to reduce the height of the whole device.

Figure 7A:
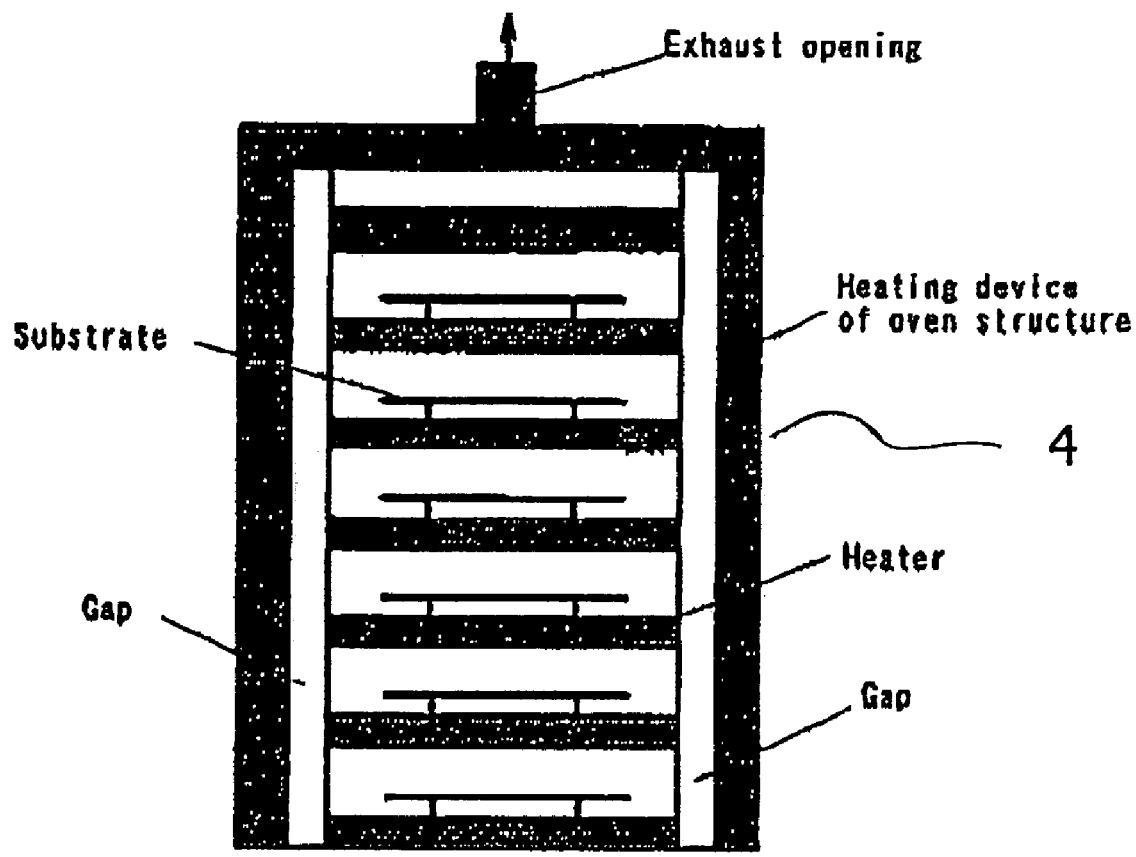
FIG. 7(a) is a vertical sectional view showing another embodiment of a drying device according to the present invention.
Figure 7B:
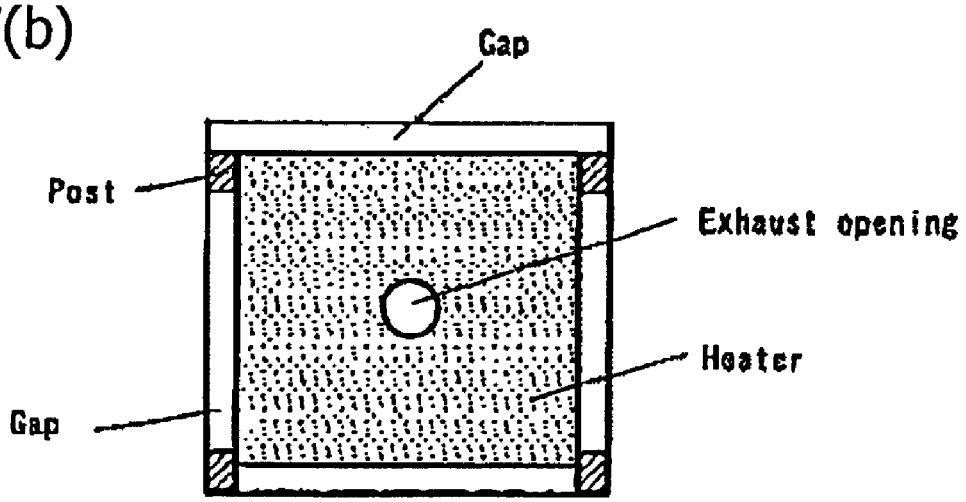
FIG. 7 (b) is a horizontal sectional view of the drying device of FIG. 7(a)

In another embodiment of the drying device 4 shown in FIG. 7(a), the drying device 4 has a plurality of stages, and a hot plate is provided in each stage for drying a wafer (substrate). An exhaust opening is provided in the top surface of the drying device 4, and exhaust air goes up through gaps which are defined on the periphery of a heater as shown in FIG. 7(b). Further, a shutter is provided in each stage. In each hot plate, there are also provided a thermocouple (not shown) and an over-temperature sensor (not shown) as well as the heater. With this structure, it is possible to gradually increase the speed of heating a wafer which is lifted with a pin and to achieve space-saving and high uniformity in the drying device.

Figure 8:
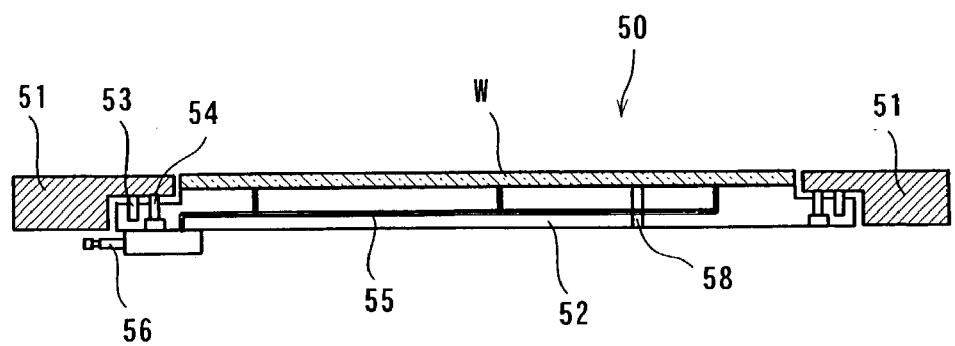
FIG. 8 is a cross-sectional view of a tray used for film forming according to an embodiment of the present invention.

As shown in FIG. 8, the tray 50, which circulates around the coating portion 10, the film-forming portion 20, the cleaning portion 30 and the drying portion 40, comprises an outer member 51 and an inner member 52. The position of the outer member 51 relative to the inner member 52 is allowed to be adjusted in the thickness direction by a screw 53 and a cap bolt 54. Specifically, the distance between the outer member 51 and the inner member 52 is increased in a case of turning the screw 53, while the distance between the outer member 51 and the inner member 52 is decreased in a case of turning the cap bolt 54.

Figure 9:
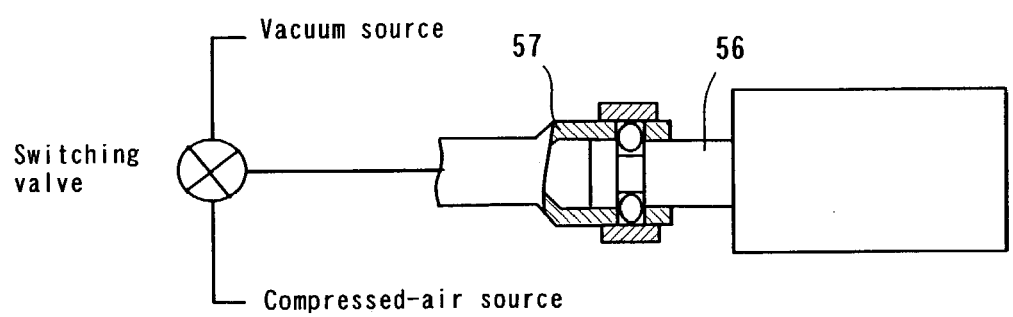
FIG. 9 is an enlarged view of a coupling portion of a tray according to an embodiment of the present invention.

A passage 55 is formed in the inner member 52, the passage 55 being branched and opened to the surface of the inner member 52. A coupler convex portion 56 is attached to the base end portion of the passage 55. As shown in FIG. 9, the coupler convex portion 56 is used for adjusting the position of the tray 50 and fixing it in each of the coating portion 10, the film-forming portion 20, the cleaning portion 30 and the drying portion 40. By coupling a coupler concave portion 57, which leads to a vacuum source via a switching valve, to the coupler convex portion 56, a substrate W is attracted to the surface of the inner member 52. On the other hand, by coupling the coupler concave portion 57, which also leads to a compressed-air source via the switching valve, to the coupler convex portion 56, it is possible to help the substrate W to be lifted from the surface of the inner member 52. Incidentally, a lift pin is used for lifting the substrate W from the surface of the inner member 52 through a penetrating hole 58 which is provided in the inner member 52.

Next, a detailed description will be given of the coating portion 10, the film-forming portion 20, the cleaning portion 30 and the drying portion 40.

Figure 10:
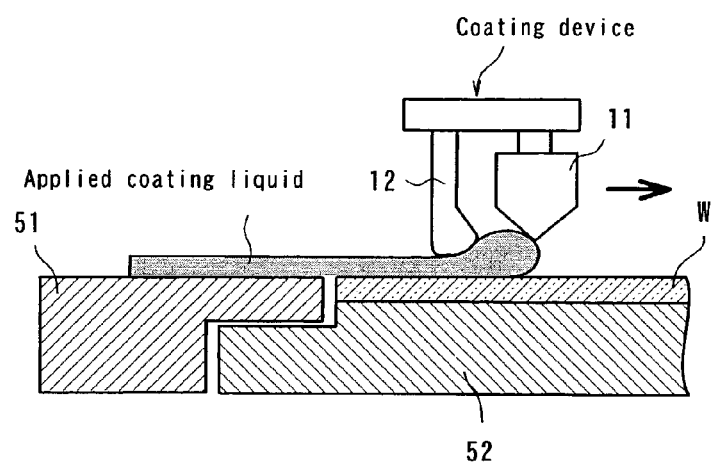
FIG. 10 is a side view of a slit nozzle according to an embodiment of the present invention.

The coating portion 10 comprises a slit nozzle 11 which can move in a reciprocating way as shown in FIG. 10. A squeegee 12 is provided to the slit nozzle 11 on the downstream side of the moving direction of the slit nozzle 11, so as to make the thickness of a coating liquid discharged from the slit nozzle uniform.

The squeegee 12 may be a separated body from the slit nozzle 11. Also, the squeegee 12 may have various kinds of shapes such as shown in FIGS. 11(a)–(c).

Figure 11:
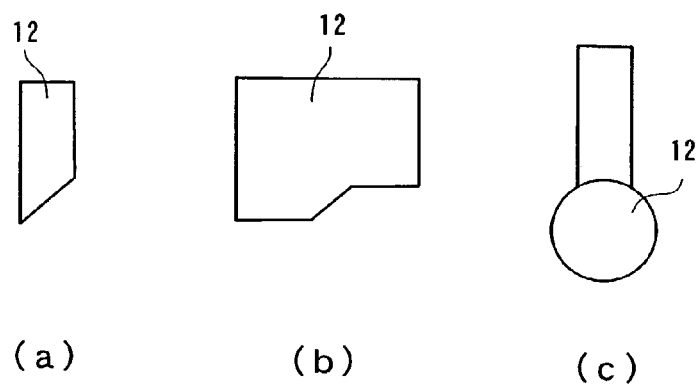
FIGS. 11 (a)–(c) are views respectively showing other embodiments of a squeegee according to the present invention.

Although the squeegee 12 may have various kinds of shapes other than the shapes shown in FIGS. 11(a)–(c), it is preferable that the shape of a portion which touches the surface of a coating liquid first is round so as to prevent the liquid from being cut. It is further preferable that the shape of the portion which touches the surface of a coating liquid first is expanded to some extent so as to easily make the liquid uniform and prevent the liquid from moving over the squeegee 12.

Figure 12:
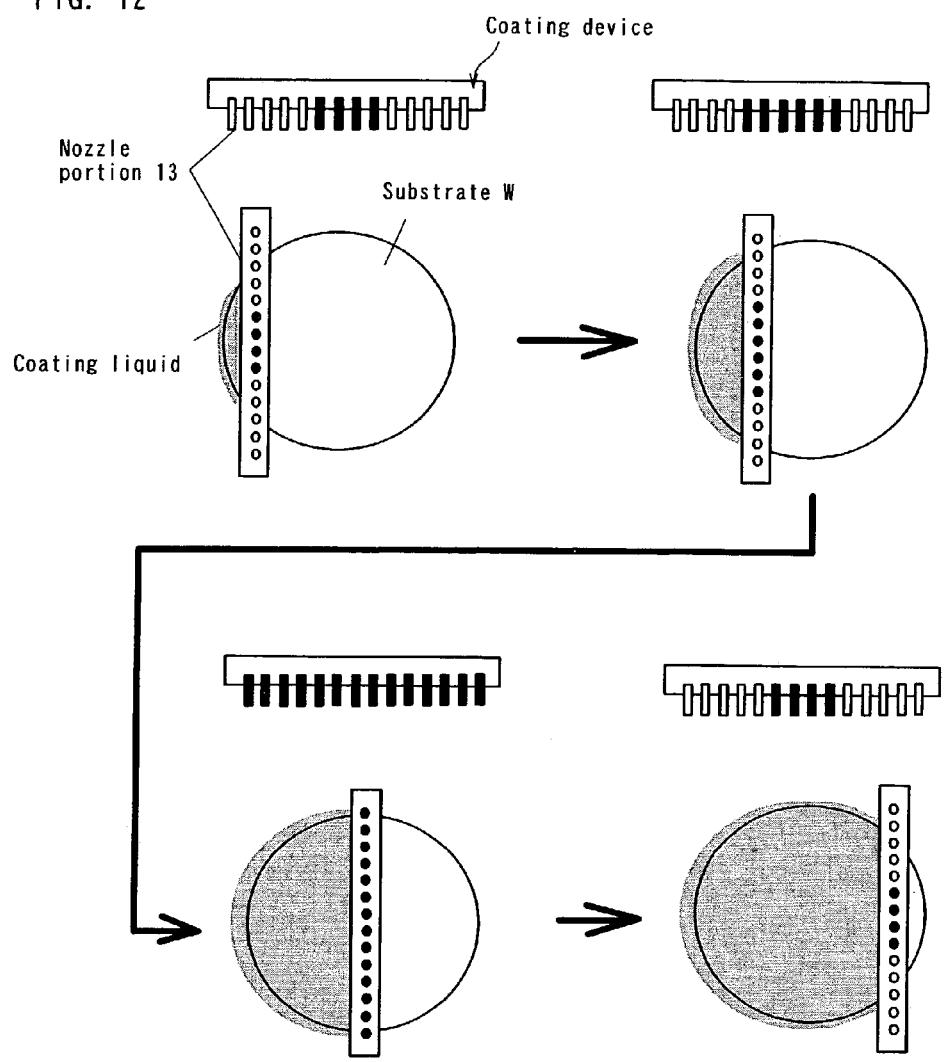
FIG. 12 is a view showing another embodiment of a coating portion of a treatment station of a film forming apparatus according to the present invention.

FIG. 12 is a view showing another embodiment of the coating portion 10 in the treatment station S2. In this embodiment, a nozzle having a lot of nozzle portions 13 provided in the width direction thereof is used as a coating device instead of the slit nozzle having an elongate opening. In a case of where the substrate W has a circular shape as a semiconductor wafer, a coating liquid is discharged only from the nozzle portions in the center at the time of initiating the application of a coating liquid, and gradually a coating liquid is also discharged from the other nozzle portions at the outside as the coating device moves. Then, the application returns to the condition where a coating liquid is discharged only from the nozzle portions in the center. As a result of this, it is possible to prevent an unnecessary waste of the liquid application.

Figure 13:
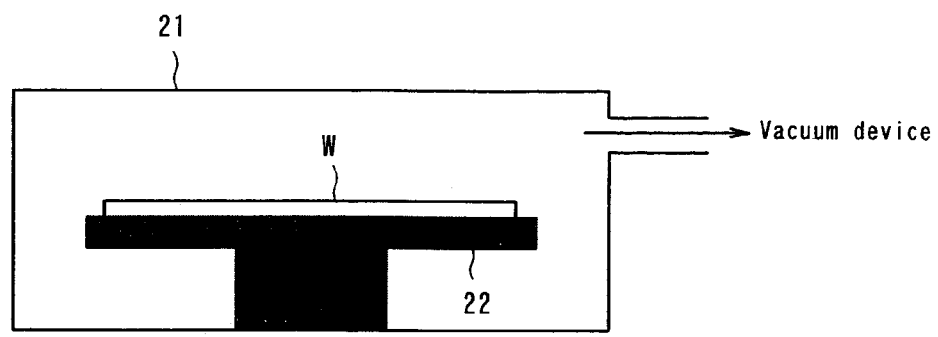
FIG. 13 is a vertical sectional view showing the details of a film-forming portion of a treatment station of a film forming apparatus according to an embodiment of the present invention.
Figure 14:
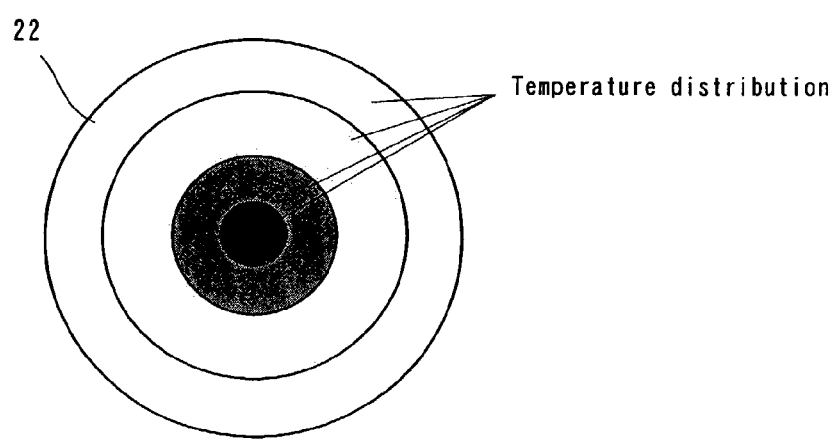
FIG. 14 is a plan view showing the temperature distribution of a hot plate of a film-forming portion according to an embodiment of the present invention.

FIG. 13 is a view showing the details of the film-forming portion 20 in the treatment station S2, and FIG. 14 is a plan view showing the temperature distribution of a hot plate of the film-forming portion 20. A pressure-reduced chamber 21 is provided in the film-forming portion 20, and a hot plate 22 is provided in the pressure-reduced chamber 21. The following description refers to the case where the hot plate 22 is provided.

In the hot plate 22, as shown in FIG. 14, the temperature-increasing areas are sorted in a concentric pattern. Specifically, the speed of increasing temperature is less in the outside areas than in the center areas. It is also possible to provide switches and to arrange the switch in the outside areas to be turned on later than the switch in the center areas, instead of sorting the speed of increasing temperature. However, the final temperature is around 90° C. in both of the center areas and the outside areas.

Figure 15:
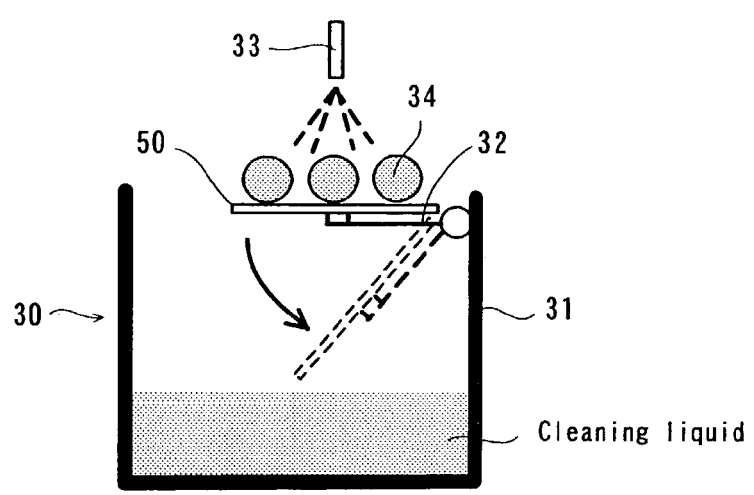
FIG. 15 is a cross-sectional view of a cleaning portion of a treatment station of a film forming apparatus according to an embodiment of the present invention.

FIG. 15 is a cross-sectional view of the cleaning portion 30 in the treatment station S2. A cleaning tank 31 is provided in the cleaning portion 30. A tray retainer 32 is attached to the cleaning tank 31 and the tray retainer 32 is allowed to move in an inclining manner. In a state where the tray retainer 32 is horizontal, a cleaning liquid is supplied from a nozzle 33 to the upper surface of the tray 50 and brush cleaning is conducted with a Teflon® brush 34. After cleaning, the tray retainer 32 is made inclined so as to discharge the cleaning liquid into the cleaning tank 31. As a method of cleaning, brush cleaning may be conducted with the brush 34 in a state where the tray retainer 32 is inclined, or the tray 50 may be immersed in a cleaning liquid.

Figure 16:
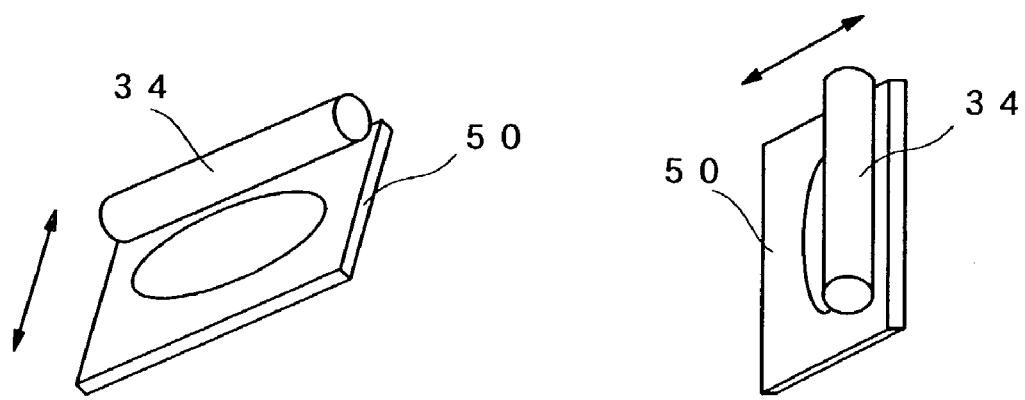
FIGS. 16(a)–(c) are views showing other embodiments of a brush of a cleaning portion according to an embodiment of the present invention.
Figure 16:
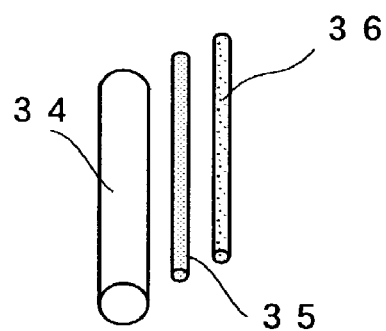

Also, as shown in FIGS. 16(a) and (b), for cleaning the tray 50, the brush 34 may be allowed to move up and down or left and right in a state where the tray retainer 32 is inclined. In addition, as shown in FIG. 16(c), a nozzle 35 for supplying a cleaning liquid, a purge nozzle 36 for drying, or the like may be provided along the brush 34. In this instance, after cleaning is conducted by moving the brush 34 up and down or left and right in a state where the tray retainer 32 is inclined, a cleaning liquid (for example, distilled water) is supplied with the nozzle 35 and then air-blowing (for example, nitrogen) is conducted with the purge nozzle 36. Incidentally, it is possible to use the tray retainer 32 which cannot be inclined. Also, a cleaning liquid may be heated, or ultrasonic cleaning may be used.

With the above-mentioned structure, an untreated substrate is drawn from the cassette 1 of the stock station S1 by the handling device 5. The substrate W is set in the concave portion of the tray 50 which stands by in the coating portion 10 of the treatment station S2. In the state where the substrate W is set in the tray 50, a coating liquid is discharged from the slit nozzle 11 to the surface of the substrate W so as to apply the liquid to surface of the substrate W. In this instance, the coupler convex portion 56 is coupled to the coupler concave portion 57 which leads to a vacuum source via a switching valve, and thereby the substrate W is attracted to the surface of the tray 50.

Then, the substrate W is fed into the film-forming portion 20 by the transfer device 60 together with the tray 50, the applied liquid is dried by heating the substrate, and thereby a coating film is formed. In the heating process, the temperature of the center portion is allowed to become high earlier than that of the other portion. Further, the heating process is conducted in a state where the pressure of the chamber 21 is reduced. By gradually reducing the pressure, by spending one minute or more, to $10^{-2}$ Torr, the solvent is prevented from being left in the coating liquid.

Figure 17:
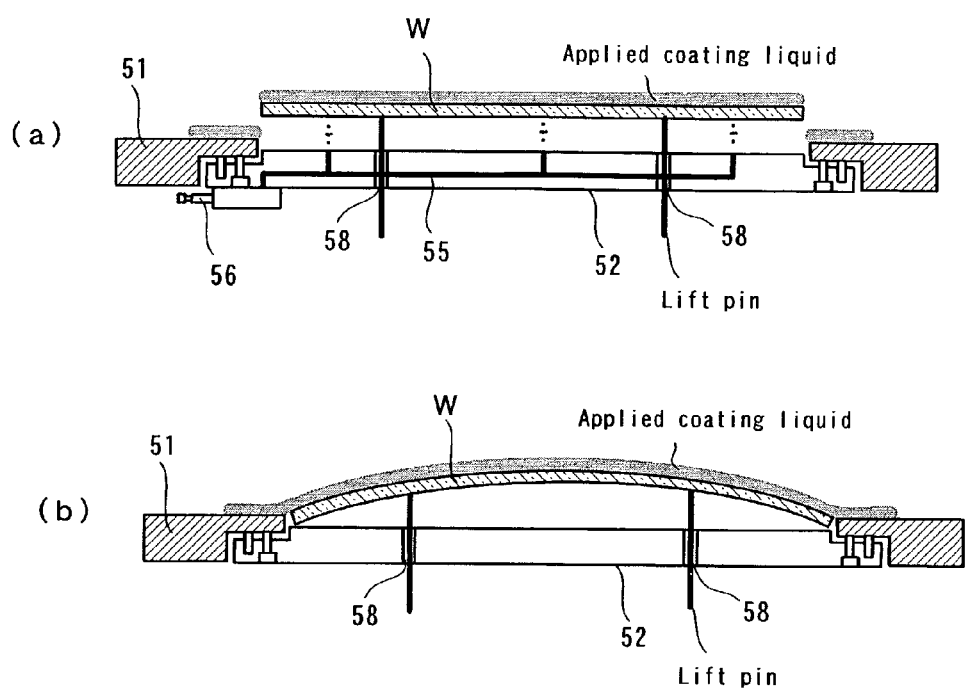
FIG. 17(a) shows a state where a substrate is lifted from a tray with the assistance of air according to the invention.
FIG. 17(b) shows a state where a substrate is lifted from a tray without the assistance of air.

After the coating film is formed, the substrate W is lifted from the tray 50 with a lift pin 58 as shown in FIG. 17(a). In this instance, the coupler convex portion 56 is coupled to the coupler concave portion 57 which also leads to a compressed-air source via the switching valve, and thereby the substrate W is smoothly lifted from the tray 50 with the assistance of air. Without the assistance of air, the substrate is flexed as shown in FIG. 17(b) because it becomes hard to cut the coating film on the substrate W and the outer member 51.

When the substrate W, on which the coating film has been formed, is lifted from the tray 50 as mentioned above, the substrate W is drawn by the handling device 5 of the stock station S1, and transferred to the edge cleaning device 3 and the drying device 4. Finally, the treated substrate is accommodated in the cassette 2.

On the other hand, the tray 50, from which the substrate W has been released, is fed into the cleaning portion 30 by the transfer device 60, and cleaned with the brush and the cleaning liquid which are mentioned above. The cleaning liquid is collected by a pump into a wastewater tank, and reused after being recovered by a distillation device.

Next, the tray 50 is fed into the drying portion 40 by the transfer device 60, dried in the drying portion 40, and finally transferred to the coating portion 10 by the transfer device 60.

As is explained in the above, according to the present invention, by forming a coating film on the surface of a substrate in a state where the substrate is mounted on the tray and by allowing the tray to circulate around a coating portion, a film-forming portion, a cleaning portion and a drying portion, it is possible to improve the processing efficiency.

Also, since the speed of increasing temperature to a predetermined temperature is allowed to be less in the outside areas than in the center areas at the time of forming a coating film by heating in the film-forming portion, it is possible to prevent a solvent of a coating liquid from being left and to remove uniformly.

In addition, since the tray is comprised of two members and the depth of a concave portion defined thereby is allowed to be adjusted, and further a passage used for vacuum suction is also used for blowing gas, it is possible to assist the release of a substrate and to prevent a cleaning liquid from entering the inside of the passage at the time of cleaning a substrate.

Although a working example of the present invention has been described above, the present invention is not limited to the working example described above, but various design alterations may be carried out without departing from the present invention as set forth in the claims.

What is claimed is:

1. An apparatus for forming a film comprising:
   a stock station which stocks a substrate;
   a tray which supports the substrate and having a concave portion for accommodating the substrate defined on the surface thereof;
   a treatment station which treats a substrate, said treatment station being disposed adjacent to said stock station and including portions for coating the substrate, film-forming on the substrate, cleaning said tray and drying said tray; and
   a transfer device circulating said tray among said portions for coating, film-forming, cleaning and drying operations.

2. The apparatus for forming a film according to claim 1, wherein said coating portion includes a squeegee for making the thickness of an applied coating liquid uniform.

3. The apparatus for forming a film according to claim 2, wherein said coating portion further includes a coating device having a slit nozzle, and said squeegee is attached to said coating device.

4. The apparatus for forming a film according to claim 1, wherein the tray comprises an outer member having an annular shape; and an inner member, wherein a concave portion for accommodating the substrate is defined by attaching said inner member to said outer member so as to cover the opening of said outer member, and wherein the position of said inner member is allowed to be adjusted with respect to said outer member in the thickness direction.

5. The apparatus for forming a film according to claim 4, wherein a passage used for vacuum suction and for gas-blowing release is provided in said inner member.

6. The apparatus for forming a film according to claim 5, wherein a coupler is provided to couple said passage to a vacuum source or a compressed-air source.

7. The apparatus for forming a film according to claim 1, wherein said transfer device is adapted to successively move the tray between said portions of said treatment station.

8. The apparatus for forming a film according to claim 1, wherein said transfer device feeds said tray sequentially from the coating portion, to the film forming portion, to the cleaning portion, and to the drying portion.

9. The apparatus for forming a film according to claim 1, wherein said said apparatus forms a thick film of an applied coating liquid.

10. An apparatus for forming a film comprising:

a stock station for a substrate; a treatment station for the substrate adjacent to said stock station; portions for coating the substrate, film-forming on the substrate, cleaning and drying a substrate support tray being provided in said treatment station; said tray having a concave portion for accommodating a substrate defined on the surface thereof; a transfer device which circulates said tray among said portions for coating, film-forming, cleaning and drying operations; and a handling device provided in said stock station to transfer, pass, and receive the substrate with respect to said treatment station, said handling device comprising a pair of hands, and said hands are supported by a member which is rotatable based on an inclined axis in a state where said hands are at 90 degrees with respect to each other.

* * * * *

UNITED STATES PATENT AND TRADEMARK OFFICE
CERTIFICATE OF CORRECTION

| | | |
|---|---|---|
| PATENT NO. | : 7,005,009 B2 | |
| APPLICATION NO. | : 10/308964 | |
| DATED | : February 28, 2006 | |
| INVENTOR(S) | : Aoki et al. | |

It is certified that error appears in the above-identified patent and that said Letters Patent is hereby corrected as shown below:

<u>Title page</u>:
Item (54), change "FILM FORMING" to --FILM-FORMING-- (both occurrences).

<u>Column 1</u>:
      Lines 1-2, change "FILM FORMING" to --FILM-FORMING-- (both occurrences).

<u>Column 3</u>:
      Line 24, change "film forming apparatus" to --film-forming apparatus--.
      Line 32, change "film forming apparatus" to --film-forming apparatus--.
      Lines 35-36, change "station of a film forming" to --station of a film-forming--.
      Line 56, change "station of a film forming" to --station of a film-forming--.
      Lines 59-60, change "station of a film forming" to --station of a film-forming--.
      Line 66, change "film forming apparatus" to --film-forming apparatus--.

<u>Column 4</u>:
      Line 15, change "film forming apparatus" to --film-forming apparatus--.

<u>Column 5</u>:
      Line 24, change "film forming apparatus" to --film-forming apparatus--.
      Lines 31-32, change "station of the film forming" to --station of the film-forming--.

<u>Column 8</u>:
      Line 45, change "which treats a substrate" to --which treats the substrate--.

UNITED STATES PATENT AND TRADEMARK OFFICE
CERTIFICATE OF CORRECTION

PATENT NO. : 7,005,009 B2
APPLICATION NO. : 10/308964
DATED : February 28, 2006
INVENTOR(S) : Aoki et al.

It is certified that error appears in the above-identified patent and that said Letters Patent is hereby corrected as shown below:

<u>Column 9</u>:
 Line 12, change "film forming portion" to --film-forming portion--.
 Line 15, change "wherein said said apparatus" to --wherein said apparatus--.

<u>Column 10</u>:
 Line 3, change "station; said" to --station, said--.

Signed and Sealed this

Eighth Day of July, 2008

JON W. DUDAS
*Director of the United States Patent and Trademark Office*